United States Patent
Zhou

(10) Patent No.: US 11,287,695 B2
(45) Date of Patent: Mar. 29, 2022

(54) SEALING FRAME, BACKLIGHT MODULE AND DISPLAY DEVICE

(71) Applicant: WUHAN CHINA STAR OPTOELECTRONICS TECHNOLOGY CO., LTD., Hubei (CN)

(72) Inventor: Zheng Zhou, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 284 days.

(21) Appl. No.: 16/492,510

(22) PCT Filed: Aug. 14, 2019

(86) PCT No.: PCT/CN2019/100535
§ 371 (c)(1),
(2) Date: Sep. 9, 2019

(87) PCT Pub. No.: WO2020/237838
PCT Pub. Date: Dec. 3, 2020

(65) Prior Publication Data
US 2021/0325734 A1    Oct. 21, 2021

(30) Foreign Application Priority Data
May 27, 2019   (CN) .......................... 201910443556.0

(51) Int. Cl.
*G02F 1/13357*    (2006.01)
*H05K 1/18*    (2006.01)

(52) U.S. Cl.
CPC ....... *G02F 1/133608* (2013.01); *H05K 1/189* (2013.01); *H05K 2201/10136* (2013.01)

(58) Field of Classification Search
CPC ............ G02F 1/133608; G02F 1/1336; G02F 1/133611; G02F 1/133615; G02F 1/05; H05K 1/189; H05K 2201/10136; H05K 3/326; H05K 2201/10128; H05K 1/147; H05K 2201/05; H05K 2201/056; G02R 12/7076
See application file for complete search history.

(56) References Cited

U.S. PATENT DOCUMENTS

2006/0264093 A1*  11/2006  Shim .................. G02F 1/13452
                                                         439/495

* cited by examiner

*Primary Examiner* — Joseph L Williams
*Assistant Examiner* — Jose M Diaz
(74) *Attorney, Agent, or Firm* — Benesch, Friedlander, Coplan & Aronoff LLP

(57) ABSTRACT

The present invention provides a sealing frame, a backlight module, and a display device. A supporting portion is disposed in a first placement slot of the sealing frame configured to accommodate a flexible printed circuit board such that when the flexible printed circuit board experiences a pulling force during assembling thereof to the backlight module, supporting portion supports the flexible printed circuit board and prevents flexible printed circuit board from suffering an excessive pulling force and transferring the force to the liquid crystal display panel to result in variation of a portion of a cell gap of the liquid crystal display panel.

14 Claims, 3 Drawing Sheets

SEALING FRAME, BACKLIGHT MODULE AND DISPLAY DEVICE

CROSS REFERENCE TO RELATED APPLICATION

This application claims the priority of International Application No. PCT/CN2019/100535, filed on 2019 Aug. 14, which claims priority to Chinese Application No. 201910443556.0 filed on 2019 May 27. The entire disclosures of each of the above applications are incorporated herein by reference.

FIELD OF INVENTION

The present invention relates to a field of display technologies, especially to a sealing frame, a backlight module and a display device.

BACKGROUND OF INVENTION

At present, a vehicle display device generally bonds a flexible printed circuit board a thin film transistor array substrate of a liquid crystal display panel by a hot-pressing process, and then employs a fixing tape to assemble the liquid crystal display panel bonded with the flexible printed circuit board on a sealing frame of a backlight module. When the flexible printed circuit board is disposed in a placement slot of the sealing frame and folded on a rear surface of the backlight module, the flexible printed circuit board fixed on an end of the thin film transistor array substrate receives a force and transfers the force to the thin film transistor array substrate to result in that a position of the cell gap on which the liquid crystal display panel is fixed with the flexible printed circuit board changes such that an issue of uneven brightness occurs when light passes through the liquid crystal display panel, i.e., the mura phenomenon.

Therefore, it is necessary to provide a technical solution to solve an issue of uneven brightness of a liquid crystal display panel due to a flexible printed circuit board assembled on a sealing module of a backlight module.

SUMMARY OF INVENTION

Technical Issue

An objective of the present invention is to provide a sealing frame, backlight module and a display device that solve an issue of uneven brightness of a liquid crystal display panel when a flexible printed circuit board is assembled to a sealing frame of a backlight module.

Technical Solution

A display device, the display device comprises a liquid crystal display panel, a flexible printed circuit board, and a backlight module, the backlight module comprises a sealing frame, the sealing frame comprises a first supporting surface, a second supporting surface protruding from the first supporting surface, and a first placement slot defined between the first supporting surface and the second supporting surface, the liquid crystal display panel is disposed securely on the first supporting surface, a supporting portion is disposed on the first supporting surface and is located in the first placement slot, one of two ends of the flexible printed circuit board is bonded to the liquid crystal display panel, the other end of the flexible printed circuit board extends through the first placement slot and is folded to be disposed on a rear surface of the backlight module, the supporting portion is configured to support the flexible printed circuit board in the first placement slot.

In the above display device, a sidewall of an end of the sealing frame is recessed to define a second placement slot, the second placement slot and the first placement slot are located at the same end of the sealing frame and communicate with each other, the other end of the flexible printed circuit board extends through the first placement slot, is folded first to extend through the second placement slot, and is folded second to be disposed on the rear surface of the backlight module.

In the above display device, a first side surface of the supporting portion near the second placement slot is flush with a first surface of the second placement slot near the supporting portion.

In the above display device, the liquid crystal display panel comprises a thin film transistor array substrate, an end of the thin film transistor array substrate near the supporting portion is bonded to the flexible printed circuit board, a colloid layer is disposed on a second side surface of the end of the thin film transistor array substrate bonded to the flexible printed circuit board near the supporting portion and fixes the flexible printed circuit board, and a first predetermined distance is defined between the colloid layer and the supporting portion.

In the above display device, a first plane of the thin film transistor array substrate is located on a side of a second plane of the supporting portion away from the first supporting surface, a vertical distance between the first plane and the second plane is a second predetermined distance, the first plane of the thin film transistor array substrate is a plane bonded to the flexible printed circuit board, the second plane of the supporting portion is a plane of the supporting portion away from the first supporting surface.

In the above display device, a length of the supporting portion along a first direction is greater than a length of the flexible printed circuit board along the first direction, and the first direction is perpendicular to a direction of the supporting portion pointing to the liquid crystal display panel and is parallel to the first supporting surface.

In the above display device, a length of the supporting portion along the first direction is equal to a length of the first placement slot along the first direction.

In the above display device, the supporting portion is a protrusion.

In the above display device, a surface of the supporting portion contacting the flexible printed circuit board is a curved surface.

In the above display device, the supporting portion is a hard rubber block.

In the above display device, the supporting portion in formed integrally with the sealing frame.

A sealing frame, the sealing frame comprises a first supporting surface, a second supporting surface protruding from the first supporting surface, and a first placement slot defined between the first supporting surface and the second supporting surface, and a supporting portion is disposed on the first supporting surface and is located in the first placement slot.

In the above sealing frame, a sidewall of an end of the sealing frame is recessed to define a second placement slot, and the second placement slot and the first placement slot are located at the same end of the sealing frame and communicate with each other.

In the above sealing frame, a first side surface of the supporting portion near the second placement slot is flush with a first surface of the second placement slot near the supporting portion.

In the above sealing frame, the supporting portion is a protrusion.

In the above sealing frame, the supporting portion is a hard rubber block.

In the above sealing frame, the supporting portion is formed integrally with the sealing frame.

A backlight module, the backlight module comprises a sealing frame, the sealing frame comprises a first supporting surface, a second supporting surface protruding from the first supporting surface, and a first placement slot defined between the first supporting surface and the second supporting surface, and a supporting portion is disposed on the first supporting surface and is located in the first placement slot.

In the above backlight module, a sidewall of an end of the sealing frame is recessed to define a second placement slot, and the second placement slot and the first placement slot are located at the same end of the sealing frame and communicate with each other.

In the above backlight module, a first side surface of the supporting portion near the second placement slot is flush with a first surface of the second placement slot near the supporting portion.

Advantages

The present invention provides a sealing frame, a backlight module, and a display device that dispose a supporting portion in the first placement slot of the sealing frame configured to accommodate the flexible printed circuit board such that when the flexible printed circuit board is assembled to a backlight module and receive a pulling force, the supporting portion supports the flexible printed circuit board and prevents that the flexible printed circuit board from an excessive pulling force, and the force transferred by an end of the flexible printed circuit board bonded to the liquid crystal display panel to the liquid crystal display panel to make a portion of the cell gap of the liquid crystal display panel vary to result in partial uneven brightness of the display device such that visual feeling of a user is enhanced.

Reference numbers are as follows:

10 liquid crystal display panel; 20 flexible printed circuit board; 30 backlight module; 40 supporting portion;

100 thin film transistor array substrate; 101 color filter substrate; 100a first plane; 100b second side surface; 50 colloid layer; d1 first predetermined distance; 301 sealing frame; 301a first supporting surface; 301b second supporting surface; 3011 first placement slot; 3012 second placement slot; 302 back panel; 303 light guide board; 304 point light source; 305 optical film; 40a second plane; 40b first side surface; 40c curved surface; 3012a first surface.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

Figure 1:
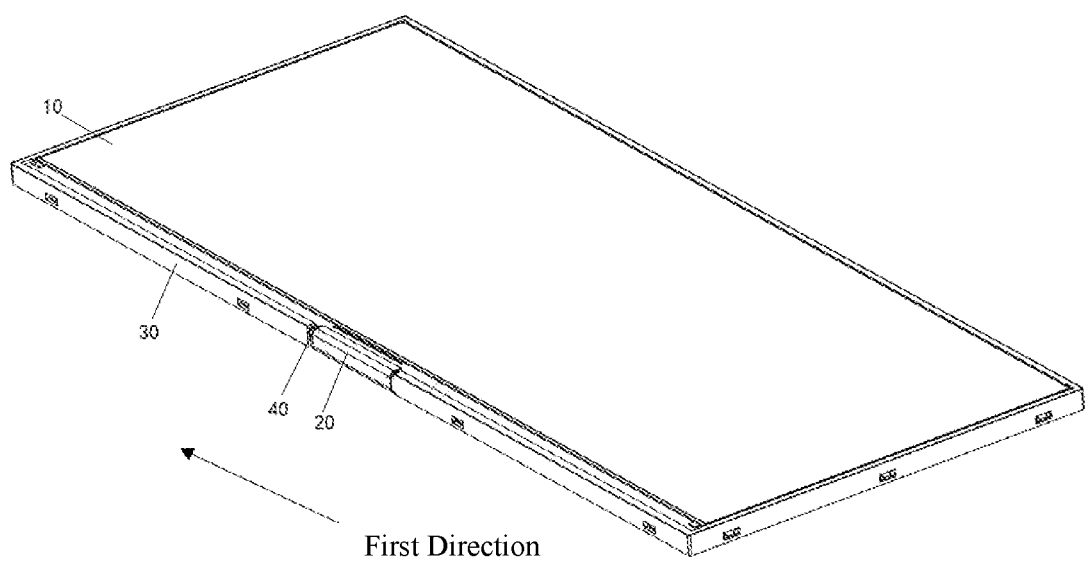
FIG. 1 is a perspective view of a display device of an embodiment of the present invention.
Figure 2:
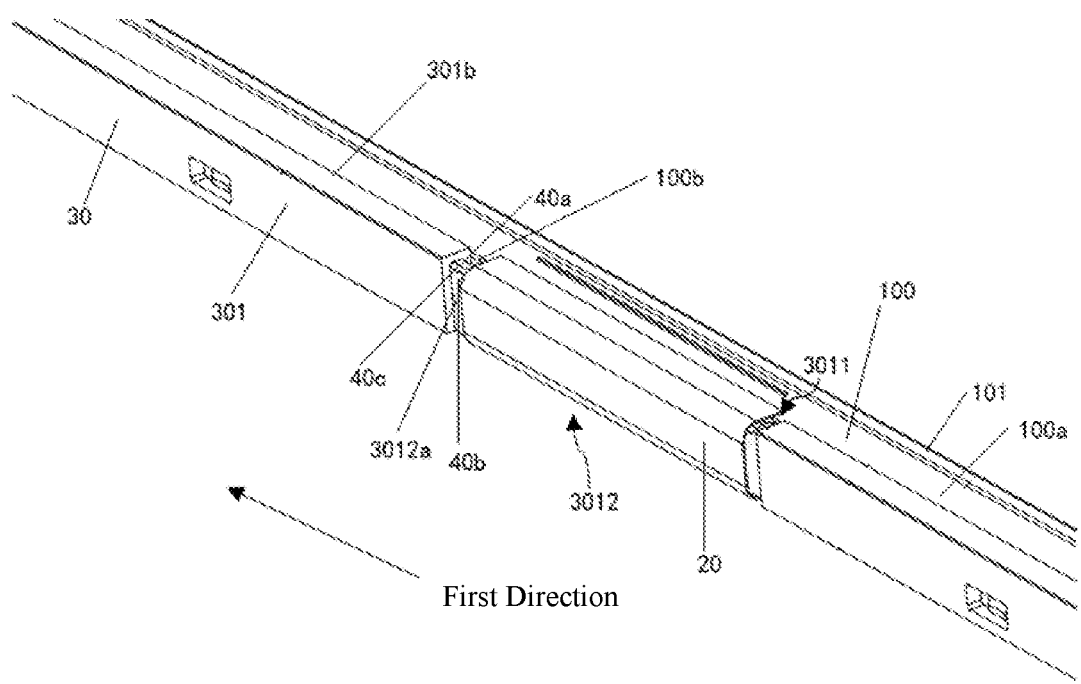
FIG. 2 is an enlarged view of the display device in FIG. 1.
Figure 3:
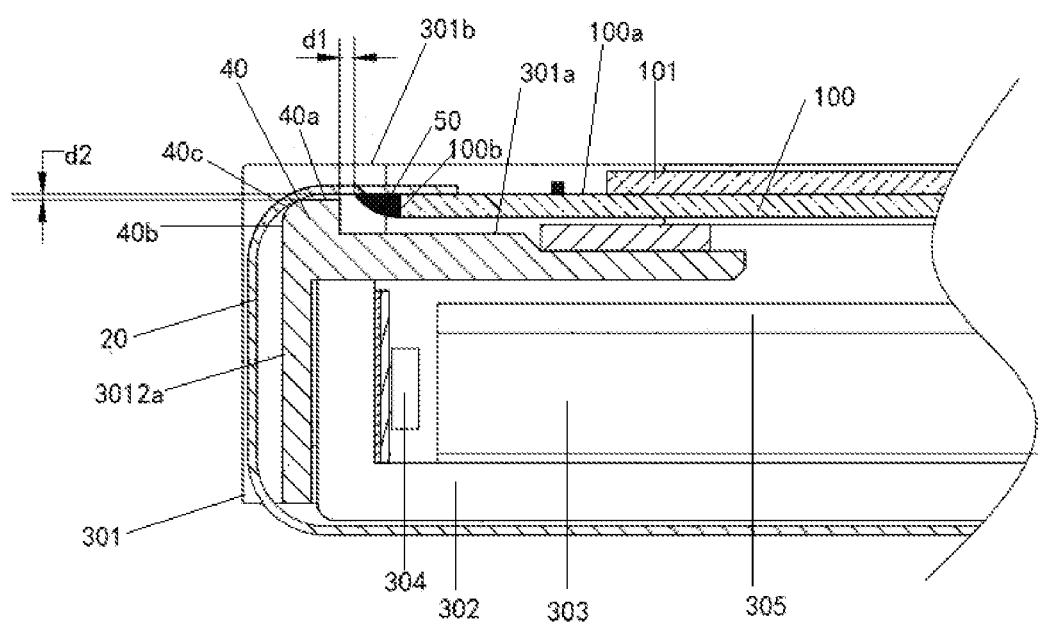
FIG. 3 is a cross sectional view of the display device in FIG. 1.

With reference to FIGS. 1 to 3, FIG. 1 is a perspective view of a display device of the present invention embodiment, FIG. 2 is an enlarged view of the display device in FIG. 1, and FIG. 3 is a cross sectional view of the display device in FIG. 1. The display device is a vehicle liquid crystal display device. The display device includes a liquid crystal display panel 10, a flexible printed circuit board 20, a backlight module 30, and a supporting portion 40.

The liquid crystal display panel 10 includes a thin film transistor array substrate 100 and a color filter substrate 101. The color filter substrate 101 is disposed opposite to the thin film transistor array substrate 100. The thin film transistor array substrate 100 extends toward a side relative to the color filter substrate 101 to form an extension region. The thin film transistor array substrate 100 and the color filter substrate 101 are both cuboid.

The thin film transistor array substrate 100 includes a first plane 100a opposite to the color filter substrate 101 and a second side surface 100b near the supporting portion 40. The first plane 100a is perpendicular to the second side surface 100b. The second side surface 100b is located on an end of the thin film transistor array substrate 100 near the supporting portion 40. The end of the thin film transistor array substrate 100 near the supporting portion 40 is bonded to the flexible printed circuit board 20. Specifically, an end of the flexible printed circuit board 20 is fixed on a first plane 100a of the extension region of the thin film transistor array substrate 100 by a hot-pressing process.

A colloid layer 50 is disposed on the second side surface 100b of the end of the thin film transistor array substrate 100 bonded to the flexible printed circuit board 20 and located near the supporting portion 40 and fixes the flexible printed circuit board 20 to prevent the end of the flexible printed circuit board 20 bonded to the thin film transistor array substrate 100 from separating from the thin film transistor array substrate 100 and to prevent stress concentration at the end of the flexible printed circuit board 20 bonded to the thin film transistor array substrate 100 that causes rupture of the flexible printed circuit board 20. A first predetermined distance d1 is defined between the colloid layer 50 and the supporting portion 40 to prevent the colloid layer 50 from contacting the supporting portion 40 and causing assembling interference. The colloid layer 50 is ultraviolet (UV) curable adhesive. The colloid layer 50 is formed on the second side surface 100b of the thin film transistor array substrate 100 by a coating process. The first predetermined distance d1 is greater than or equal to 0.5 mm.

The backlight module 30 includes a sealing frame 301. The sealing frame 301 includes a first supporting surface 301a, a second supporting surface 301b protruding from the first supporting surface 301a, a first placement slot 3011, and a second placement slot 3012. A step region is formed between the first supporting surface 301a and the second supporting surface 301b to accommodate the flexible printed circuit board 20. The step region is the first placement slot 3011, in other words, the first placement slot 3011 is formed between the first supporting surface 301a and the second supporting surface 301b. A sidewall of an end of the sealing frame 301 is recessed to define the second placement slot 3012. The second placement slot 3012 is also configured to accommodate the flexible printed circuit board 20. The second placement slot 3012 and the first placement slot 3011 are located at the same end of the sealing frame 301 and communicate with each other. One of two ends of the flexible printed circuit board 20 is bonded to the liquid crystal display panel 10. The other end of the flexible printed circuit board 20 extends through the first placement slot 3011, is folded first to extend through the second placement slot 3012, and is folded second to be disposed on a rear surface of the backlight module 30.

It can be understood that the sidewall of the sealing frame 301 can be disposed without the second placement slot 3012, the other end of the flexible printed circuit board 20 extends through the first placement slot 3011, is folded first, passes through the sidewall, is folded second to be disposed on the rear surface of the backlight module 30. In other words, the other end of the flexible printed circuit board 20 extends through the first placement slot 3011 and is folded to be disposed on the rear surface of the backlight module 30. Using the flexible printed circuit board 20 to accommodate the second placement slot 3012 prevents damages of the flexible printed circuit board 20.

Specifically, the sealing frame 301 includes a hollow rectangular bottom frame, the rectangular bottom frame includes a first supporting surface 301a, and the liquid crystal display panel 10 is fixed on the first supporting surface 301a. A plane on the thin film transistor array substrate 100 opposite to the first plane 100a is fixed on the first supporting surface 301a of the rectangular bottom frame by a double-sided tape or a foam tape. An annular flange is formed on an outer edge contour surrounding the first supporting surface 301a. A plane of the annular flange away from the first supporting surface 301a is a second supporting surface 301b. The second supporting surface 301b is configured to support a cover plate disposed on a side of the liquid crystal display panel 10 away from the backlight module 30, a touch display panel, or a front frame. A notch is defined in the annular flange to expose the first supporting surface 301a, and the step region is formed between the first supporting surface 301a and the second supporting surface 301b in which the notch is defined. The sealing frame 301 further includes the sidewall surrounding the rectangular bottom frame. The sidewall of the end of the sealing frame 301 disposed with the first placement slot 3011 is recessed to define the second placement slot 3012, and the second placement slot 3012 communicates with the first placement slot 3011. Widths of the first placement slot 3011 and the second placement slot 3012 are equal to each other and are greater than a width of the flexible printed circuit board 20 such that the flexible printed circuit board 20 can extend through the first placement slot 3011 and the second placement slot 3012.

The backlight module 30 further includes a back panel 302, a light guide board 303, a point light source 304, and an optical film 305. The sealing frame 301 is fixed on the back panel 302. The light guide board 303 is disposed in the back panel 302. The point light source 304 is disposed in an inner surface of a sidewall of the back panel 302 and faces a side surface of the light guide board 303. The optical film 305 is disposed on a side of light guide board 303 on which a light emitting surface is located. The point light source 304 is a light emitting diode, and light emitted by the point light source 304 is processed by the light guide board 303 to form an area light source. The area light source is processed by the optical film 305 to make brightness of light entering the liquid crystal display panel 10 has uniformity.

The supporting portion 40 is a protrusion. The supporting portion 40 includes a second plane 40a and a first side surface 40b. The second plane 40a of the supporting portion 40 is a plane of the supporting portion 40 away from the first supporting surface 301a, in other words, the second plane 40a of the supporting portion 40 is a top surface of the supporting portion 40. The second plane 40a of the supporting portion 40 is located on a side of the second supporting surface 301b near the first supporting surface 301a. The first side surface 40b of the supporting portion 40 is a side surface of the supporting portion 40 near the second placement slot 3012. The first side surface 40b of the supporting portion 40 near the second placement slot 3012 is flush with the first surface 3012a of the second placement slot 3012 near the supporting portion 40 such that the flexible printed circuit 20 can be directly received in the second placement slot 3012 after supported and folded by the supporting portion 40, which prevents the flexible printed circuit board 20 transferred from the supporting portion 40 to the second placement slot 3012 from being further folded to enter second placement slot 3012 and prevents the flexible printed circuit board 20 from suffering excessive stress.

The supporting portion 40 can be cuboid, at the meantime, the first side surface 40b is perpendicular to the second plane 40a. Furthermore, a surface of the supporting portion 40 contacting the flexible printed circuit board 20 is a curved surface 40c. In other words, a right angle between the first side surface 40b and the second plane 40a is beveled and rounded to form the smooth curved surface 40c to prevent burr between a corner between the first side surface 40b and the second plane 40a resulting in damages of the flexible printed circuit board 20. A radius of the curved surface 40a is 0.3±0.05 mm.

The supporting portion 40 can be formed integrally with the sealing frame 301 to simplify the manufacturing processes. The supporting portion 40 can also be separate from the sealing frame 301. For example, supporting portion 40 is a hard rubber block such that the supporting portion 40 is able to support the flexible printed circuit board 20 whilst preventing the flexible circuit board 20 from being damaged. hard rubber block can be fixed in the first placement slot 3011 of the first supporting surface 301a by a double-sided tape.

A length of the supporting portion 40 along a first direction is equal to a length of the first placement slot 3011 along the first direction. Therefore, the supporting portion 40 is connected to the above annular flange. A length of the supporting portion 40 along the first direction is greater than a length of the flexible printed circuit board 20 along the first direction to assure that the supporting portion 40 can support the entire flexible printed circuit board 20 along the first direction. The first direction is perpendicular to a direction of the supporting portion 40 pointing to the liquid crystal display panel 10 and is parallel to the first supporting surface 301a.

One of two ends of the flexible printed circuit board 20 is bonded to the liquid crystal display panel 10. The other end of the flexible printed circuit board 20 extends through the first placement slot 3011 and is folded to be disposed on the rear surface of the backlight module 30. A first plane 100a of the thin film transistor array substrate 100 is located a side of the second plane 40a of the supporting portion 40 away from the first supporting surface 301a. A vertical distance between the first plane 100a and the second plane 40a is a second predetermined distance d2 to prevent assembling interference resulting from the supporting portion 40 pressing against the flexible printed circuit board 20 due to assembling tolerance and thickness tolerance. In other words, in the first placement slot 3011, a suspension part is defined partially between the flexible printed circuit board 20 and the supporting portion 40, and then the supporting portion 40 supports the flexible printed circuit board 20. The first plane 100*a* of the thin film transistor array substrate 100 is a plane bonded to the flexible printed circuit board 20 plane. The second predetermined distance d2 is 0.2±0.05 mm.

The display device of the present invention disposes a supporting portion in the first placement slot of the sealing frame configured to accommodate the flexible printed circuit board such that when the flexible printed circuit board is assembled to a backlight module and receive a pulling force, the supporting portion supports the flexible printed circuit board and prevents that the flexible printed circuit board from an excessive pulling force, and the force transferred by an end of the flexible printed circuit board bonded to the liquid crystal display panel to the liquid crystal display panel to make a portion of the cell gap of the liquid crystal display panel vary to result in partial uneven brightness of the display device such that visual feeling of a user is enhanced.

The present invention also provides a sealing frame, and the sealing frame includes a first supporting surface, a second supporting surface protruding from the first supporting surface, and a first placement slot defined between the first supporting surface and the second supporting surface. A supporting portion is disposed on first supporting surface and is located in the first placement slot.

The sealing frame of the present invention is configured to accommodate the supporting portion disposed in the first placement slot of the flexible printed circuit board such that the supporting portion supports the flexible printed circuit board after the flexible printed circuit board to be assembled extends through the first placement slot, which prevents that the flexible printed circuit board from an excessive pulling force during assembling, and the force transferred by an end of the flexible printed circuit board bonded to the liquid crystal display panel to the liquid crystal display panel to make a portion of the cell gap of the liquid crystal display panel vary The present invention also provides a backlight module, and the backlight module includes the above sealing frame.

The backlight module of the present invention disposes the supporting portion in the first placement slot of the sealing frame configured to accommodate the flexible printed circuit board such that when the flexible printed circuit board of the liquid crystal display panel to be disposed on the backlight module is disposed on the backlight module, the supporting portion supports the flexible printed circuit board, and prevents that the flexible printed circuit board from an excessive pulling force, and the force transferred by an end of the flexible printed circuit board bonded to the liquid crystal display panel to the liquid crystal display panel to make a portion of the cell gap of the liquid crystal display panel vary.

The above descriptions of the embodiments are only technical solutions for helping to understand the present invention and their core ideas. A person of ordinary skill in the art should understand that they can still modify the technical solutions described in the each of the embodiments, or equivalently replace part of the technical features. Such modifications or substitutions make none of nature of the corresponding technical solutions depart from the scope of the technical solutions of each of the embodiments of the present invention.

What is claimed is:

1. A display device, wherein the display device comprises a liquid crystal display panel, a flexible printed circuit board, and a backlight module, the backlight module comprises a sealing frame, the sealing frame comprises a first supporting surface, a second supporting surface protruding from the first supporting surface, and a first placement slot defined between the first supporting surface and the second supporting surface, the liquid crystal display panel is disposed securely on the first supporting surface, a supporting portion is disposed on the first supporting surface and is located in the first placement slot, one of two ends of the flexible printed circuit board is bonded to the liquid crystal display panel, the other end of the flexible printed circuit board extends through the first placement slot and is folded to be disposed on a rear surface of the backlight module, the supporting portion is configured to support the flexible printed circuit board in the first placement slot;

wherein a sidewall of an end of the sealing frame is recessed to define a second placement slot, the second placement slot and the first placement slot are located at the same end of the sealing frame and communicate with each other, the other end of the flexible printed circuit board extends through the first placement slot, is folded first to extend through the second placement slot, and is folded second to be disposed on the rear surface of the backlight module;

wherein a first side surface of the supporting portion near the second placement slot is flush with a first surface of the second placement slot near the supporting portion.

2. The display device as claimed in claim 1, wherein the liquid crystal display panel comprises a thin film transistor array substrate, an end of the thin film transistor array substrate near the supporting portion is bonded to the flexible printed circuit board, a colloid layer is disposed on a second side surface of the end of the thin film transistor array substrate bonded to the flexible printed circuit board near the supporting portion and fixes the flexible printed circuit board, and a first predetermined distance is defined between the colloid layer and the supporting portion.

3. The display device as claimed in claim 2, wherein a first plane of the thin film transistor array substrate is located on a side of a second plane of the supporting portion away from the first supporting surface, a vertical distance between the first plane and the second plane is a second predetermined distance, the first plane of the thin film transistor array substrate is a plane bonded to the flexible printed circuit board, the second plane of the supporting portion is a plane of the supporting portion away from the first supporting surface.

4. The display device as claimed in claim 1, wherein a length of the supporting portion along a first direction is greater than a length of the flexible printed circuit board along the first direction, and the first direction is perpendicular to a direction of the supporting portion pointing to the liquid crystal display panel and is parallel to the first supporting surface.

5. The display device as claimed in claim 4, wherein a length of the supporting portion along the first direction is equal to a length of the first placement slot along the first direction.

6. The display device as claimed in claim 1, wherein the supporting portion is a protrusion.

7. The display device as claimed in claim 6, wherein a surface of the supporting portion contacting the flexible printed circuit board is a curved surface.

8. The display device as claimed in claim 1, wherein the supporting portion is a hard rubber block.

9. The display device as claimed in claim 1, wherein the supporting portion in formed integrally with the sealing frame.

10. A sealing frame, wherein the sealing frame comprises a first supporting surface, a second supporting surface protruding from the first supporting surface, and a first placement slot defined between the first supporting surface and the second supporting surface, and a supporting portion is disposed on the first supporting surface and is located in the first placement slot;
    wherein a sidewall of an end of the sealing frame is recessed to define a second placement slot, and the second placement slot and the first placement slot are located at the same end of the sealing frame and communicate with each other;
    wherein a first side surface of the supporting portion near the second placement slot is flush with a first surface of the second placement slot near the supporting portion.

11. The sealing frame as claimed in claim 10, wherein the supporting portion is a protrusion.

12. The sealing frame as claimed in claim 10, wherein the supporting portion is a hard rubber block.

13. The sealing frame as claimed in claim 10, wherein the supporting portion is formed integrally with the sealing frame.

14. A backlight module, wherein the backlight module comprises a sealing frame, the sealing frame comprises a first supporting surface, a second supporting surface protruding from the first supporting surface, and a first placement slot defined between the first supporting surface and the second supporting surface, and a supporting portion is disposed on the first supporting surface and is located in the first placement slot;
    wherein a sidewall of an end of the sealing frame is recessed to define a second placement slot, and the second placement slot and the first placement slot are located at the same end of the sealing frame and communicate with each other;
    wherein a first side surface of the supporting portion near the second placement slot is flush with a first surface of the second placement slot near the supporting portion.

\* \* \* \* \*